(12) United States Patent
Tang et al.

(10) Patent No.: US 6,211,092 B1
(45) Date of Patent: Apr. 3, 2001

(54) COUNTERBORE DIELECTRIC PLASMA ETCH PROCESS PARTICULARLY USEFUL FOR DUAL DAMASCENE

(75) Inventors: Betty Tang; Jian Ding, both of San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/112,864

(22) Filed: Jul. 9, 1998

(51) Int. Cl.$^7$ ............................................ H01L 21/3065
(52) U.S. Cl. .................... 438/719; 438/723; 438/724; 438/725; 438/736
(58) Field of Search ..................... 438/729, 715, 438/638, 723, 700, 736, 733, 709, 719, 725, 724; 204/192.3; 216/13

(56) References Cited

U.S. PATENT DOCUMENTS

| | | | |
|---|---|---|---|
| 5,356,515 | 10/1994 | Tahara | 156/643 |
| 5,374,332 | * 12/1994 | Koyama et al. | 216/13 |
| 5,399,237 | 3/1995 | Keswick et al. | 156/643 |
| 5,503,901 | * 4/1996 | Sakai et al. | 438/723 |
| 5,578,523 | * 11/1996 | Fiordalice et al. | 438/633 |
| 5,589,041 | * 12/1996 | Lantsman | 204/192.3 |
| 5,595,627 | * 1/1997 | Inazawa et al. | 438/715 |
| 5,612,254 | 3/1997 | Mu et al. | 437/195 |
| 5,635,423 | * 6/1997 | Huang et al. | 438/638 |
| 5,683,548 | * 11/1997 | Hartig et al. | 438/729 |
| 5,741,626 | * 4/1998 | Jain et al. | 430/314 |
| 5,877,075 | * 3/1999 | Dai et al. | 438/597 |
| 6,043,164 | * 3/2000 | Nguyen et al. | 438/736 |

FOREIGN PATENT DOCUMENTS

| | | |
|---|---|---|
| 797242A2 | 9/1997 | (EP) . |
| 840365A2 | 10/1997 | (EP) . |
| 849789A2 | 12/1997 | (EP) . |

* cited by examiner

Primary Examiner—Benjamin L. Utech
Assistant Examiner—Binh X. Tran
(74) Attorney, Agent, or Firm—Charles Guenzer

(57) ABSTRACT

A dielectric etch process particularly applicable to forming a dual-damascene interconnect structure by a counterbore process, in which a deep via is etched prior to the formation of a trench connecting two of more vias. A single metallization fills the dual-damascene structure. The substrate is formed with a lower stop layer, a lower dielectric layer, an upper stop layer, and an upper dielectric layer. For example, the dielectric layers may be silicon dioxide, and the stop layers, silicon nitride. The initial deep via etch includes at least two substeps. A first substep includes a non-selective etch through the upper stop layer followed by a second substep of selectively etching through the lower dielectric layer and stopping on the lower stop layer. The first substep may be preceded by yet another substep including a selective etch part ways through the upper dielectric layer. For the oxide/nitride compositions, the selective etch is based on a fluorocarbon and argon chemistry, preferably with a lean etchant of $CHF_3$ combined with a polymer former, such as $C_2F_6$, $C_4F_8$, or $CH_2F_2$, and the non-selective etch includes a fluorocarbon or hydrocarbon, argon and an oxygen-containing gas, such as CO. The counterbore etch is preferably performed in a high-density plasma reactor which allows the plasma source region to be powered separately from a sheath bias located adjacent to the wafer pedestal.

33 Claims, 7 Drawing Sheets

COUNTERBORE DIELECTRIC PLASMA ETCH PROCESS PARTICULARLY USEFUL FOR DUAL DAMASCENE

RELATED APPLICATION

This application is related to Ser. No. 09/112,094 concurrently filed on Jul. 9, 1998 by Hung et al.

FIELD OF THE INVENTION

The invention relates generally to plasma etch processes. In particular, the invention relates to the highly selective etching of insulating materials, particularly silicon oxide, forming part of a complex integrated-circuit structure.

BACKGROUND ART

The technology of fabricating semiconductor integrated circuits continues to advance in the number of transistors, capacitors, or other electronic devices which can be fabricated on a single integrated circuit chip. This increasing level of integration is being accomplished in large part by decreasing the minimum feature sizes. Even as the number of layers in the integrated circuit continues to increase, advanced processes are being used which allow for a reduction in the number of processing steps for a functional layer. However, these advanced processes often make extraordinary demands upon the chemistry of the etching process. Dielectric etching has presented some of the most difficult demands.

In the past the common materials for inter-level dielectric have been based upon silicon, such as silicon dioxide, silica glass such as BPSG, and related silicon-based oxide materials that serve as electrical insulators. Recently, interest has developed in insulating materials with low dielectric constants (low-k dielectrics), some of which are based upon silicon but others are based upon carbon.

Advanced integrated circuits contain multiple wiring layers separated from the silicon substrate and from each other by respective dielectric layers. Particularly logic circuitry, such as microprocessors, require several layers of metallization with intervening inter-level dielectric layers. Small contact or via holes need to be etched through each of the dielectric layers. The contact or via holes are then filled with a conductor, composed typically of aluminum in the past but more recently composed of copper. A horizontal wiring layer is formed over one dielectric layer and then covered by another dielectric layer. The horizontal wiring and the underlying vias are often referred to as a single wiring layer. The conventional process not only fills the contact or via holes but also overfills them to form a thick planar layer over both the filled holes and the dielectric. Conventionally, a metal lithographic step then photographically defines a photoresist layer over the planar metal layer and etches the exposed metal into a network of conductive interconnects.

In contrast, a recently developed damascene process substitutes chemical mechanical polishing for metal etching. A dual-damascene structure, as illustrated in sectioned isometric view in FIG. 1, has been proposed for advanced chips which avoids the metal etching and combines the metallization of the via and horizontal interconnect. There are two general types of dual-damascene processes, self-aligned and counterbore. The more conventional self-aligned dual-damascene process will be described first.

Over a substrate 10 is formed a thin lower stop layer 12 having a minimal thick of, for example 100 nm, a lower dielectric layer 14, having a thickness of, for example, 1 µm or somewhat less, and a thin upper stop layer 16. The stop layers 12, 16 have compositions relative to the dielectric material such that a carefully chosen etch process that is selective to the material of the stop layer etches through the overlying dielectric but stops on the stop layer. Although copper metallization and low-k dielectric would more fully utilize the advantage of the dual-damascene structure, the present description will use silicon dioxide as the principal inter-level dielectric. Silicon dioxide is preferably grown by plasma-enhanced chemical vapor deposition (PECVD) using tetraethylorthosilicate (TEOS) as the main precursor gas. Silicon nitride ($Si_3N_4$) is a common material for stop layers when the dielectric is an oxide. Silicon nitride is preferably also grown by PECVD to reduce the thermal budget, and its general composition is given by $SiN_x$, where x may vary somewhat over a range of, for example 1 to 1.5. A dielectric photolithographic step is then performed to create circular holes 18 in the upper stop layer 16. The diameters of the circular holes 18 determine the diameters of the via holes, which usually represent the smallest dimension defined in the dielectric etch. The smallest defined lateral dimension in a level is often referred to as the critical dimension (CD). The dual-damascene structure can be used both at the power level, which is the uppermost metal layer, and at the signal levels, for example, metal-1 and metal-2 levels for a moderately complex logic chip. The power level typically has a larger via size, for example, 0.6 µm, while the signal levels typically have smaller via sizes, for example, 0.3 µm. This diameter is being reduced to 0.25 µm and to yet lower sizes in advanced structures. Total dielectric thickness also varies between the power and signal levels. The etching in this photolithographic step is preferably selective to the principal dielectric material so that at this point the holes 18 do not significantly extend into the lower dielectric layer 14.

Then, in the continuation of the self-aligned dual-damascene process, an upper dielectric layer 20 is deposited to a thickness of, for example, 1.4 µm over the partially etched structure, including deposition into the etched depressions in the patterned nitride layer 16. A photoresist mask is deposited and defined into the shape of a trench 22 having a width of, for example, 1.2 µm and a much longer length. A self-aligned dual-damascene dielectric etch is then performed both to form the trench 22 in the upper oxide layer 20 and to extend the lower via holes 18 through the lower oxide layer 14 and down to the lower stop layer 12. The upper nitride stop layer 16 serves both as a stop for forming the trench 22 and as a hard mask for etching the via hole 18. The combined etch must not significantly etch the upper stop layer 16 at the floor 24 of the trench 22, and it must stop at the lower stop layer 12 at the bottom 26 of the via holes 18. In a further step, not illustrated here because it is generally considered to be non-crucial, a further non-selective etch removes the portion of the lower stop layer 12 at the bottom of the via hole 18 so as to expose the substrate 10 to contacting when metal is filled into the trench 22 and via hole 18.

In the self-aligned dual-damascene etch process, the selectivity of the oxide etch to nitride or other stop material in both the relatively open trench floor 24 and particularly at the shoulders 28 of the via holes 18 is especially crucial since these areas are exposed to the etching plasma while the via holes 18 are being etched. Generally, the shoulders 28 etch faster than the trench floor 24 because of the exposed geometry. The upper nitride layer 16 and its shoulder 28 are further exposed during a long over-etch of the lower oxide layer 14, typically greater than 100% to reliably open the via in the presence of process and other non-uniformities. Such selectivity can be achieved by use of a highly polymerizing chemistry which deposits a protective polymeric coating on the non-oxide surfaces and vertical oxide surfaces but generally not on the horizontal oxide surfaces. However, the extensive polymerization impacts the etching of the narrow and deep via holes 18 and may cause etch stop. Etch stop occurs when the side walls are so heavily polymerized that the polymer closes the hole and prevents further etching of the bottom of the hole. Of course, etch stop in the via holes 18 must be avoided. As a result, the process window for the self-aligned process is often limited by the conflicting requirements of the oxide etch to maintain the nitride shoulders 28 while continuing to open the oxide in the via hole 18. The etch must maintain the bottom critical dimension (CD) associated with the via hole 18 in order to maintain tight control of the via resistance. The top critical dimension associated with the trench 22 is less critical, but depending upon the pitch of via holes 18, it may determine the margin for shorting between vias associated with different trenches. The trench profile needs to be vertical to maintain consistent line widths.

Following the etching of the dual-damascene structure by either the self-aligned or counterbore process, a single metallization operation fills both the via holes 18 and the trench 22. The metallization operation may require that the trench 22 and via hole 18 be coated with barrier layers and wetting layers, as has become well known in metallization of small features in advanced integrated circuits. The metal deposition, usually performed at least partially by physical vapor deposition, is continued to the extent that the metal completely fills the via holes 18 and trench 22 and somewhat overlies the top 30 of the upper oxide layer 20. Chemical mechanical polishing is then performed, and because silica is much harder than metal the polishing stops when it encounters the upper oxide layer 20. Thereby, the metallization is restricted on the top of the wafer to the trench 22. The metallization may either serve both as a horizontal interconnect between two or more locations in the substrate through the via holes 18 and as an inter-level vertical interconnect in the via holes 18. The dual-damascene process is particularly useful for copper metallization because no copper etching is required.

In the self-aligned dual-damascene process, the lower stop layer 12 is photolithographically patterned before the upper dielectric layer 20 is deposited, and the trench and the via are etched in a single process step. Such a process requires balancing nitride selectivity against etch stop margin, and achieving a wide process window for an acceptable process poses a great challenge in developing an oxide etch recipe.

An alternative dual-damascene process, referred to as a counterbore dual-damascene process for reasons which will become apparent, separates the via and trench etch steps. Thereby, the nitride shoulder need not be exposed for such long times to the oxide etch so that the balance between selectivity and etch stop is eased. The counterbore process is thus advantageous for smaller via sizes.

The counterbore process is illustrated in the flow diagram of FIG. 2 with reference to the cross-sectional structures of FIGS. 3–8, which show the sequential development of the dual-damascene structure. In step 40, an unpatterned, planar dual-damascene structure is grown comprising, as illustrated in the cross-sectional view of FIG. 3, the substrate 10, the lower stop layer 12, the lower dielectric layer 14, the upper stop layer 16, and the upper dielectric layer 20. No photolithography is performed between the layers 12, 14, 16, and 20, and their compositions may be such to allow their growth by chemical vapor deposition (CVD) in a single plasma reaction chamber by varying the composition of the feed gas and the operating conditions between the layers.

In step 42, a first photoresist layer 44 is deposited and photographically patterned to form mask apertures 46 corresponding to the via or contact holes, only one of which is illustrated. It will be assumed that the underlying substrate 10 includes a metal surface in the area of the hole so it is properly called a via hole. Although the metal is preferably copper, the examples of the invention use an aluminum metallization. The composition of the metallization has very little effect upon the dielectric etch.

In a first etch step 48, an extended via hole 50, as illustrated in FIG. 4, is etched through the upper dielectric layer 20, the upper stop layer 16, and the lower dielectric layer 14 down to the lower stop layer 12. The etch chemistry is chosen to be selective to the material of the lower stop layer 12 so that the etch stops at the top surface 52 of the bottom stop layer 12.

In an unillustrated step, the first photoresist layer 44 is stripped. In step 54, a second photoresist layer 56, as illustrated in FIG. 5, is deposited and photographically patterned to form a mask aperture 58 corresponding to the trench. In a second etch step 60, a trench 62, illustrated in FIG. 6, is etched through the upper dielectric layer 20 down to the top surface 64 of the upper stop layer 16 without significantly eroding the top surface 52 of the bottom stop layer 12. The depth of the extended via hole 50 is thereby reduced to form a via hole 50'.

In a third etch step 66, the exposed portion of lower stop layer 12 at the bottom of the via hole 50' is etched, as illustrated in FIG. 7, through the lower stop layer 12 and down to an upper surface 68 of the substrate 10, which is typically a metal for a via. Depending upon the compositions of the two stop layers 12, 16, the third etch step 66 may remove portions of the upper stop layer 16 exposed at the bottom of the trench 62 to form a shelf 70 in the upper oxide layer 14, but this thin portion is not critical. In another unillustrated step, performed either before or after the third etch step 66, the second photoresist layer 56 is stripped along with any sidewall polymer forming in the dielectric etch.

Thereafter, as illustrated in FIG. 8, a metal 72 is filled into the trench 62 and underlying via hole 50' to contact the upper surface 68 of the substrate 10. Subsequent chemical mechanical polishing (CMP) removes any metal overflowing the trench 62. The metal 72 forms both a horizontal interconnect 74 and a via 76 contacting the underlying layer 10. As mentioned before, the metal 72 may be the conventional aluminum or the more advanced copper.

However, the counterbore etch process is very demanding. The first, via etch 48 of the extended via hole 50 is deep and narrow, the width usually representing the critical dimension of the process. The via etch 48 must etch through the upper stop layer 16 but stop on the lower stop layer 12. The deep via etch 48 thus requires a vertical profile and high selectivity to the bottom stop layer 12. Not only must the interconnect (trench) etch 60 stop on the upper stop layer 16, it must not significantly etch the lower stop layer 12, which is exposed during the entire interconnect etch. The interconnect etch 60 thus requires a vertical profile and high selectivity to the upper stop layer 16. If the lower stop layer 12 is inadvertently etched through during the long over-etch, an effect called punch through, the underlying metal is sputtered, and as a result device reliability is severely impacted, particularly if copper is used as the underlying metallization. All etch steps, but particularly those etching through the thicker dielectric layers, should be highly isotropic, producing nearly vertical side walls. To achieve the vertical profile, the etching of the stop layers should not significantly side etch the dielectric layers located above.

The first, via etch step 48 must selectively etch the upper stop layer 16 relative to the lower stop layer 12. This can be accomplished in a single etch step with the choice of significantly different materials for the two stop layer 12, 16. However, the choice is limited and not attractive. The growth of the planar structure of FIG. 3 is preferably performed in a single CVD reactor, which may be difficult to accomplish for materials of vastly different chemistries. Also, it is desired to form both stop layers 12, 16 out of materials having fairly good insulating properties. Use of conductive metals for either stop layer would form a grounding plane, thus introducing electrical coupling between interconnects on the same level. For similar reasons, the vertical extent of the stop layers formed of only fair insulators should be kept thin so as to reduce the lateral electrical conductance. Silicon nitride and related compounds such as some low-k silicon-based dielectrics have reasonably high resistivities, can be grown in the same chamber as oxides, and nitride-selective oxide etches are known, but it is not seen how to form two layers of such materials with vastly different etching characteristics while simultaneously maintaining high dielectric-to-stopper selectivity.

It is thus desired to find a etching process satisfying these difficult and conflicting requirements without unduly complicating and lengthening the dielectric etch step.

SUMMARY OF THE INVENTION

The invention may be summarized as a plasma etch method, preferably performed in a single inductively coupled high-density plasma (HDP) reactor, of etching through a multi-layer dielectric stack including an intermediate and lower stop layer. The etch continues through the intermediate stop layer but stops on the lower stop layer. The etch includes at least two substeps, a earlier one of which is non-selective to the intermediate stop layer, a later one being selective to the lower stop layer.

In a first preferred 2-substep sequence: a first, non-selective etch extends to below the upper stop layer; and a second, selective etch extends to and stops on the lower stop layer. In a second preferred 3-substep sequence: a first, selective etch on average does not quite reach the upper stop layer; a second, non-selective etch punches through the upper stop layer; and a third, selective etch extends to and stops on the lower stop layer.

The invention may be applied to a dielectric stack structure in which the dielectric layers are composed of silicon dioxide or related silicon oxide materials and the stop layers are composed of silicon nitride. With these compositions, the stack may be grown in a single plasma reactor. For a stack of oxide and nitride, the selective etch may be a polymerizing fluorocarbon reactive ion etch and the non-selective etch is accomplished by adding an oxygen-containing gas, such as CO, to the etching gas mixture.

In a multi-step etching process, preferably only the gas components are changed between the steps. More preferably, the principal etching gas remains substantially the same with only the selective addition of polymer formers and oxygen-containing gases, thus providing a smoother transition between the steps with no fear of extinguishing the plasma. The changes in total active gas flow can be easily kept below 30%.

The etching process is advantageously performed at a relatively high pressure in the range of 40 to 150 milliTorr or more advantageously in the range of 60 to 100 milliTorr in the presence of diluent gas such as argon having a fraction at least twice that of the etching gases.

Preferably, the selective etch uses both a lean hydrofluorocarbon, such as trifluoromethane ($CHF_3$), and a polymer-forming fluorocarbon or hydrofluorocarbon. The strength of polymerization depends upon the aspect ratio of the feature being etched and whether the photoresist needs to be protected. The ratio of trifluoromethane to the polymer former is preferably in the range of 5 to 20. Preferred polymer formers are hexafluoroethane ($C_2F_6$), cyclic octafluorobutane ($C_4F_8$), and difluoromethane ($CH_2F_2$), dependent upon the geometry of the feature being currently etched.

A hot silicon surface may be used to scavenge fluorine from the selective etching gas to provide yet higher selectivity to both nitride and photoresist.

Etching in a high-density plasma enhances polymerization to thereby increase selectivity and cracks CO into elemental oxygen, which provides better selectivity to photoresist than gaseous oxygen.

The invention is particularly applicable to a counterbore dual-damascene etch having two dielectric layers underlaid with respective stop layer. This etch process requires an initial very deep via etch through the upper stop layer and both dielectric layers down to the lower stop layer.

DETAILED DESCRIPTION OF THE PREFERRED EMBODIMENTS

We have found that the counterbore process can be effectively applied to a dual-damascene structure by using a multi-substep etch for the deep via etch step. The process window is improved by the addition of certain gas species to control selectivity to the stop layers. In one embodiment of the invention, the damascene structure incorporates only silicon oxide and silicon nitride layers, and the deep via etch can include features associated with a conventional deep contact etch.

From the view of an integrated process, the counterbore damascene method helps to maintain consistent via sizes. The critical dimension at the bottom of the via hole is defined during the deep via etch, and any misalignment of the trench mask will not affect the via contact area with the underlying metal. This insensitivity to misalignment is crucial for via resistance, especially as the via size shrinks to 0.25 μm and below. In contrast, the self-aligned damascene process is susceptible to this misalignment problem, which affects the distribution of the via resistance.

Figure 1:
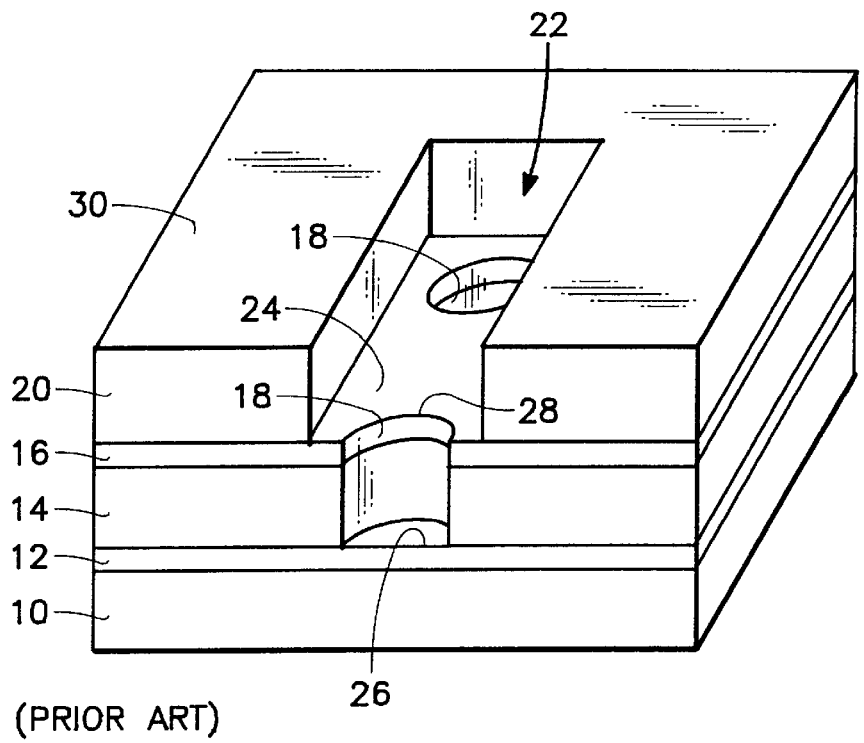
FIG. 1 is an isometric view of the etched hole required for a dual-damascene via structure for interconnecting two levels of metallization.
Figure 2:
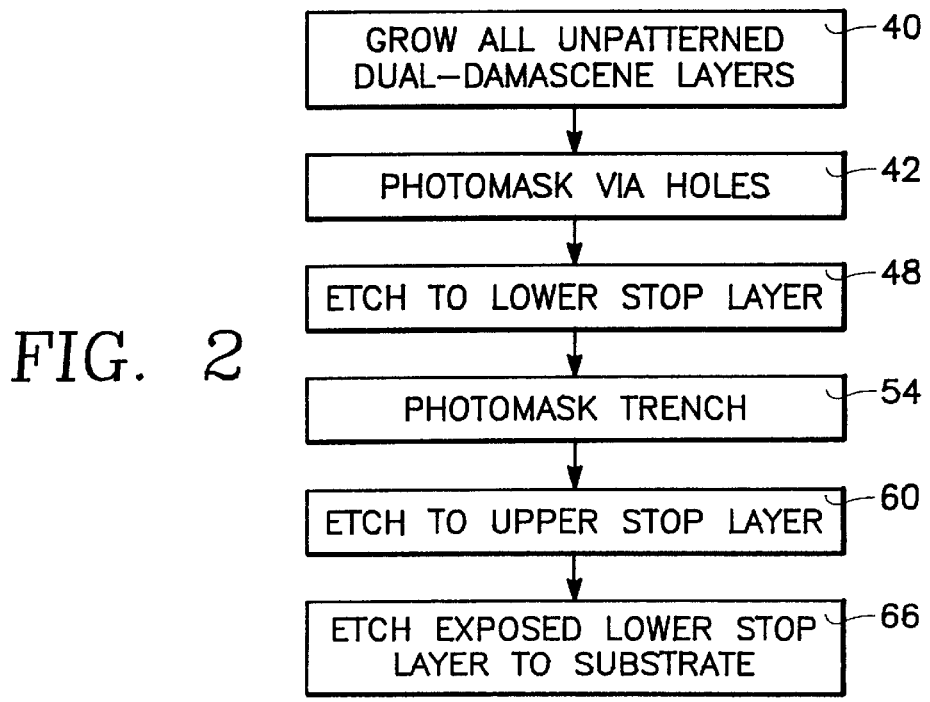
FIG. 2 is a process flow diagram for the counterbore dual-damascene etch of the invention.
Figure 3:
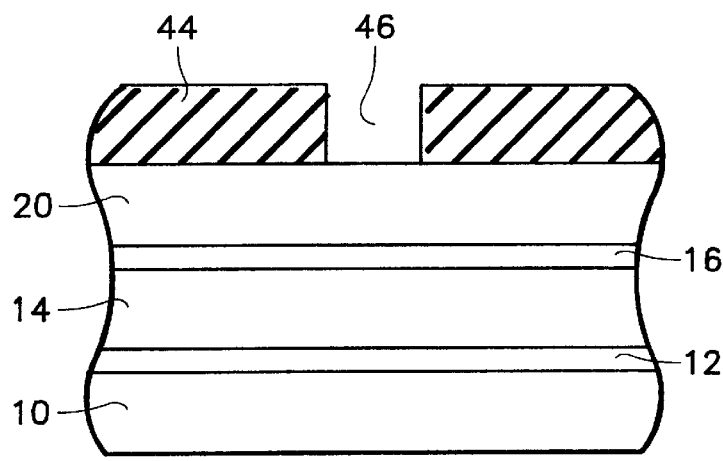
FIGS. 3 through 7 are cross-sectional views of the sequentially developed structure in the counterbore dual-damascene etch process of FIG. 2.
Figure 4:
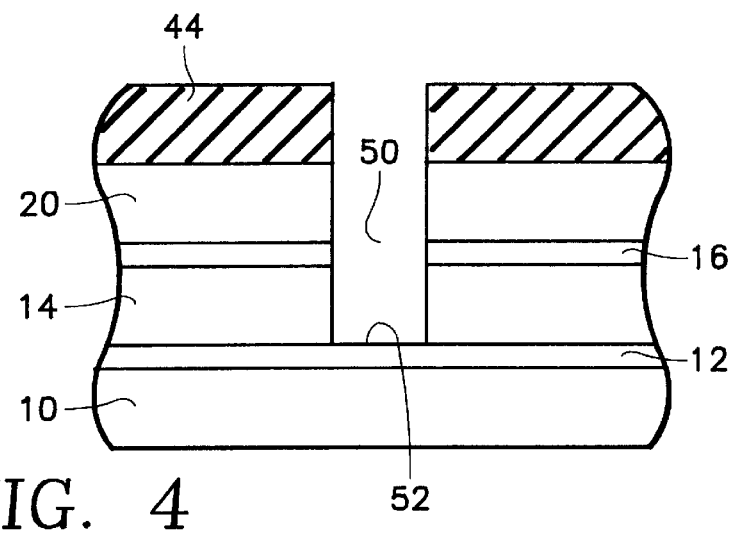
Figure 5:
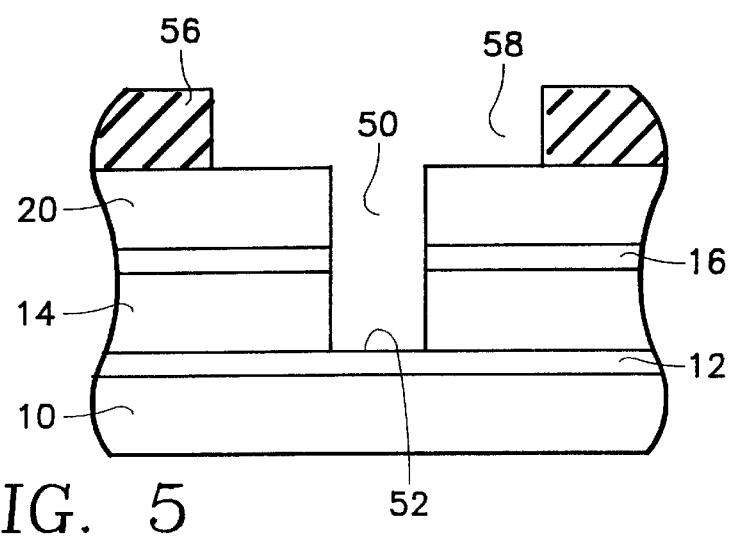
Figure 6:
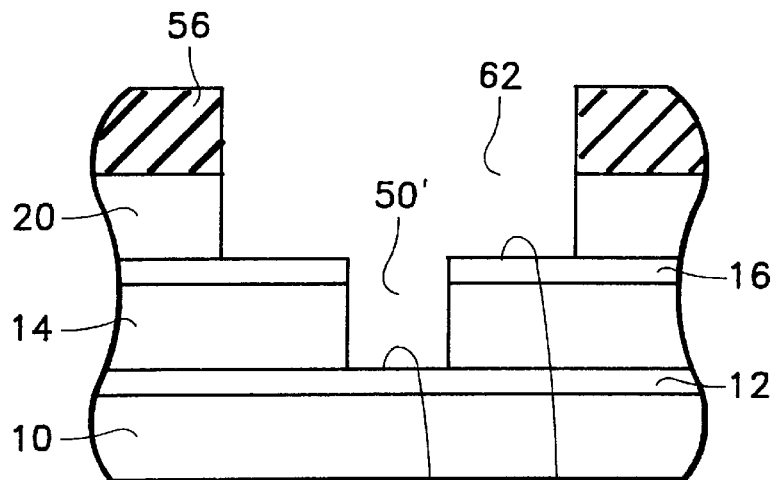
Figure 7:
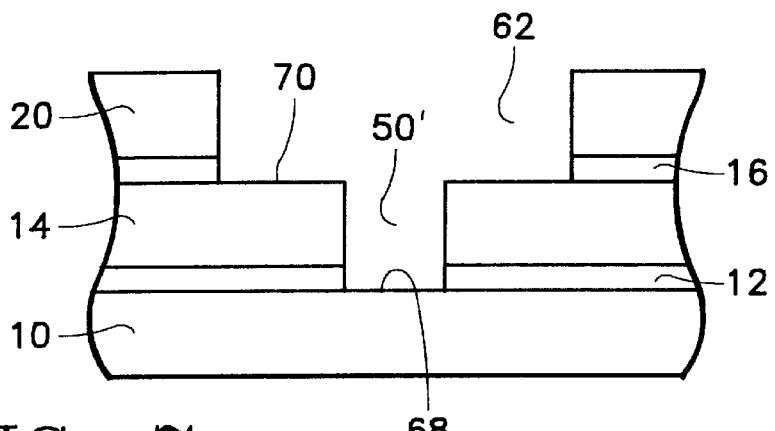
Figure 8:
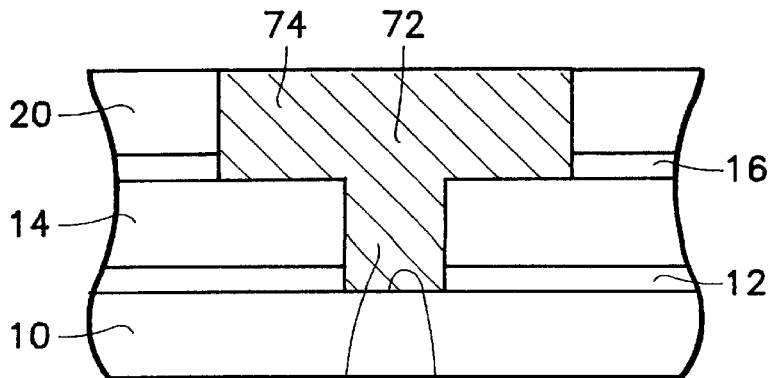
FIG. 8 is a cross-sectional view of the metallization formed in the dual-damascene etch structure of FIG. 8.

An exemplary unpatterned structure, as illustrated in FIG. 3, is tabulated in TABLE 1. This structure was used in an example to be described later for a 0.3 μm-diameter via.

TABLE 1

|  | Composition | Thickness (nm) |
| --- | --- | --- |
| Upper Dielectric | Oxide | 500 |
| Upper Stopper | Nitride | 150 |
| Lower Dielectric | Oxide | 1000 |
| Lower Stopper | Nitride | 100 |

The oxide is nominally composed of silicon dioxide grown by a standard plasma-enhanced CVD process using TEOS (tetraethylorthosilicate) as the principal precursor. The nitride is composed of silicon nitride, nominally of composition $Si_3N_4$, grown by plasma-enhanced CVD. The thermal budget is improved because plasma-enhanced CVD of nitride can be performed around 400° C. while thermal CVD requires temperatures of greater than 700° C. All depositions can thus be performed in the same plasma reaction chamber which is adapted for the supply of the different gases and includes hardware compatible with the two types of deposited materials. The silicon nitride has a relatively high dielectric constant of 7.5, compared to 3.9 for $SiO_2$, and has a low but still significant electrical conductivity. Therefore, the thickness of the nitride stop layers should be kept low.

Although all the etching steps of the counterbore process need to be consistent with the compositions of TABLE 1, the first etching step 48 to form the extended via hole 50 is the most demanding. We found that a process for the via etching step involving two or three substeps performed in an inductively coupled high-density plasma (HDP) etch reactor successfully achieves the first, via etching step. Such a reactor provides both the selectivity and the process flexibility required to satisfy the conflicting requirements. Such a reactor can also be advantageously used for the second and third etching steps as well as for the photoresist stripping. There are other types of high-density plasma reactors, including remote plasma source (RPS) and electron-cyclotron resonance (ECR). A high-density plasma may be defined as a plasma filling the entire space it is in, excluding plasma sheaths, and having an ionization density of at least $10^{11}$ cm$^{-3}$.

Figure 9:
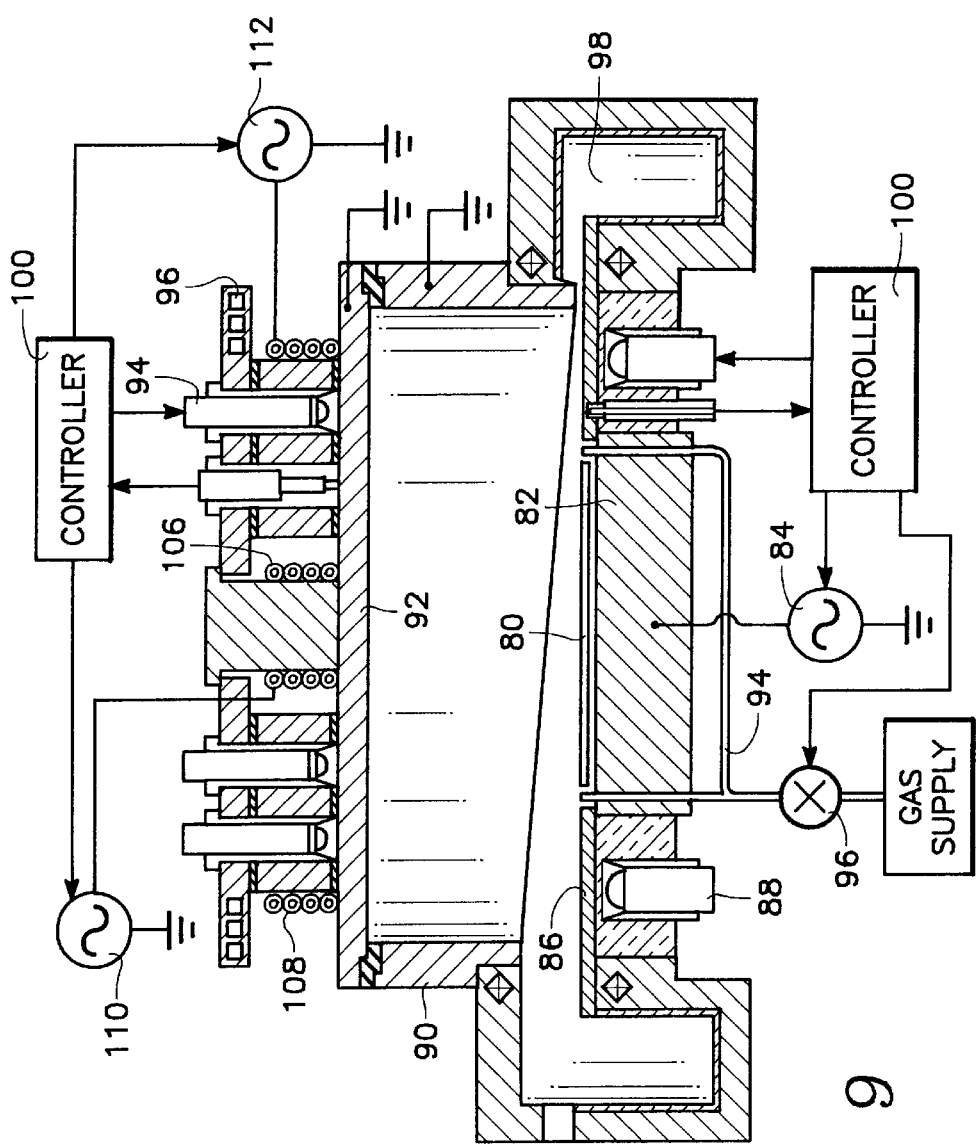
FIG. 9 is a schematic illustration, partially in cross-sectional view, of an inductively coupled high-density plasma reactor on which the invention may be practiced.

An example of such an inductively coupled HDP etch reactor is the IPS (inductive plasma source) oxide etch reactor available from Applied Materials, Inc. of Santa Clara, Calif. and described by Collins et al. in U.S. patent application, Ser. No. 08/733,544, filed Oct. 21, 1996. The general reactor structure and some auxiliary equipment are illustrated in partial cross section in FIG. 9. A wafer 80 to be processed is supported on a cathode pedestal 82, which is supplied with RF power from a first RF power supply 84. A silicon ring 86 surrounds the pedestal 82 and is controllably heated by an array of heater lamps 88. A grounded silicon wall 90 surrounds the plasma processing area. A silicon roof 92 overlies the plasma processing area, and lamps 94 and water cooling channels 96 control its temperature. The temperature-controlled silicon ring 86 and to a lesser extent the silicon roof 92 can be used to scavenge fluorine from the fluorocarbon or other fluorine-based plasma. Processing gas is supplied from one or more bottom gas feeds 94 through a bank of mass flow controllers 96. Alternatively, a top gas feed may be formed as a small showerhead in the center of the silicon roof 92. An unillustrated vacuum pumping system connected to a pumping channel 98 around the lower portion of the chamber maintains the interior of the chamber at a preselected pressure. A system controller 100 controls the operation of the reactor and its auxiliary equipment.

In the used configuration, the silicon roof 92 is grounded, but its semiconductor resistivity and thickness are chosen to pass generally axial RF magnetic fields produced by an inner inductive coil stack 106 and an outer inductive coil stack 108 powered by respective RF power supplies 110, 112. Alternatively, a single RF power supply may be used in conjunction with a selectable power splitter. Other coil configurations are possible, for example, as in the TCP reactor having a flat, spiral inductive coil overlying the roof 92.

The system controller 100 controls the mass flow controllers 96, the heater lamps 88, 94, the supply of chilled water to the cooling channels 96, the throttle valve to the vacuum pumps, and the power supplies 84, 110, 112. All these regulated functions control the etching chemistry in conformance to a process recipe of the sort to be described in the examples below. The process recipe is stored in the controller 100 in magnetic, optical, or semiconductor memory, as is well known in the art, and the controller 100 reads the recipe from a recording medium inserted into it. It is typical for the equipment supplier to provide recipes on magnetic media such as floppy disks or optical media such as CDROMs, which are then read into controller 100.

A principal advantage of the inductively coupled plasma reactor is that different amounts of power can be supplied to the inductive coils 106, 108 and to the capacitive pedestal 82. The inductive power creates a plasma source region located in large part remotely from the wafer 30 while the capacitive power controls the plasma sheath adjacent to the wafer 30 and thus determines the DC bias across the sheath at the wafer 30. The source power can be raised to increase the etching rate and control the number and type of excited radicals while the bias power can be varied to cause ions to be accelerated across the plasma sheath with either high or low energy and which then strike the wafer 30 with the selected energy.

Figure 10:
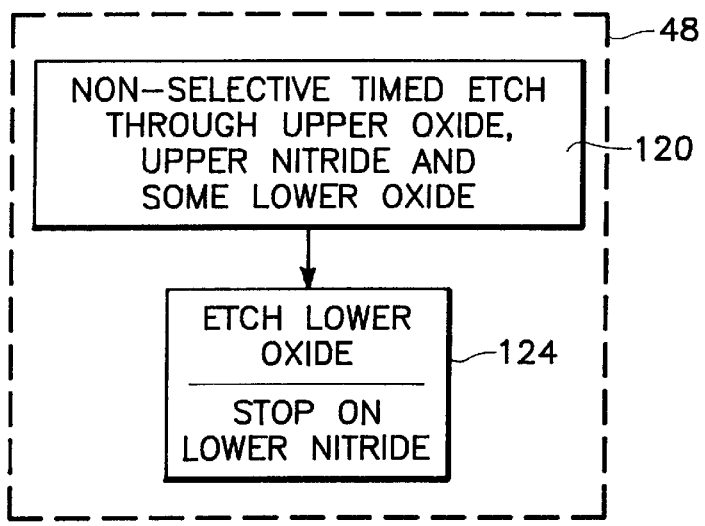
FIG. 10 is a process flow diagram for an inventive 2-substep form of the via etching step of the counterbore dual-damascene etch process of FIG. 2.
Figure 11:
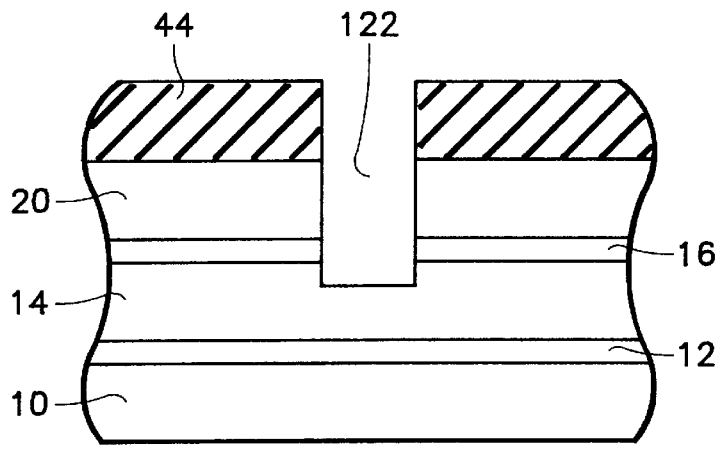
FIGS. 11 and 12 are cross-sectional views of the sequentially developed structure in the 2-substep via etching step of FIG. 10.
Figure 12:
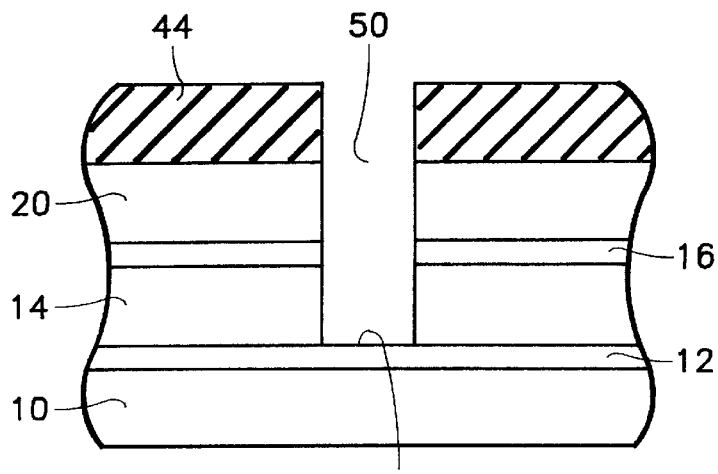

A first, 2-substep embodiment of the via etching step 48 is shown by the flow diagram of FIG. 10 with reference to the structures of FIGS. 11 and 12. A first substep 120 is a non-selective timed etch that, as illustrated in FIG. 11, etches a hole 122 through the upper oxide layer 20, the upper nitride stop layer 16, and part way into the lower oxide layer 14. A second nitride-selective etch step 124 selectively etches through the lower oxide layer 14 and stops on the lower nitride stop layer 12 to form the extended via hole 50 of FIG. 12.

EXAMPLE 1

The 2-substep via etching step 48 has been performed upon the structure presented above in TABLE 1 using the process recipe of following TABLE 2. The mask for the via hole etch had a diameter of 0.3 μm.

TABLE 2

|  | First Substep | Second Substep |
|---|---|---|
| $CHF_3$ Flow (sccm) | 80 | 80 |
| $C_2F_6$ Flow (sccm) | 10 | 10 |
| CO Flow (sccm) | 15 | 0 |
| Ar Flow (sccm) | 425 | 425 |
| Inner Source Power (W) | 710 | 710 |
| Outer Source Power (W) | 2310 | 2310 |
| Bias Power (W) | 1400 | 1400 |
| Pressure (mT) | 75 | 75 |
| Roof Temp. (° C.) | 145 | 145 |
| Ring Temp. (° C.) | 350 | 350 |
| Cathode Temp. (° C.) | −10 | −10 |
| Backside He Pressure (T) | 15 | 15 |
| Time (s) | 60 | 80 |

Figure 13:
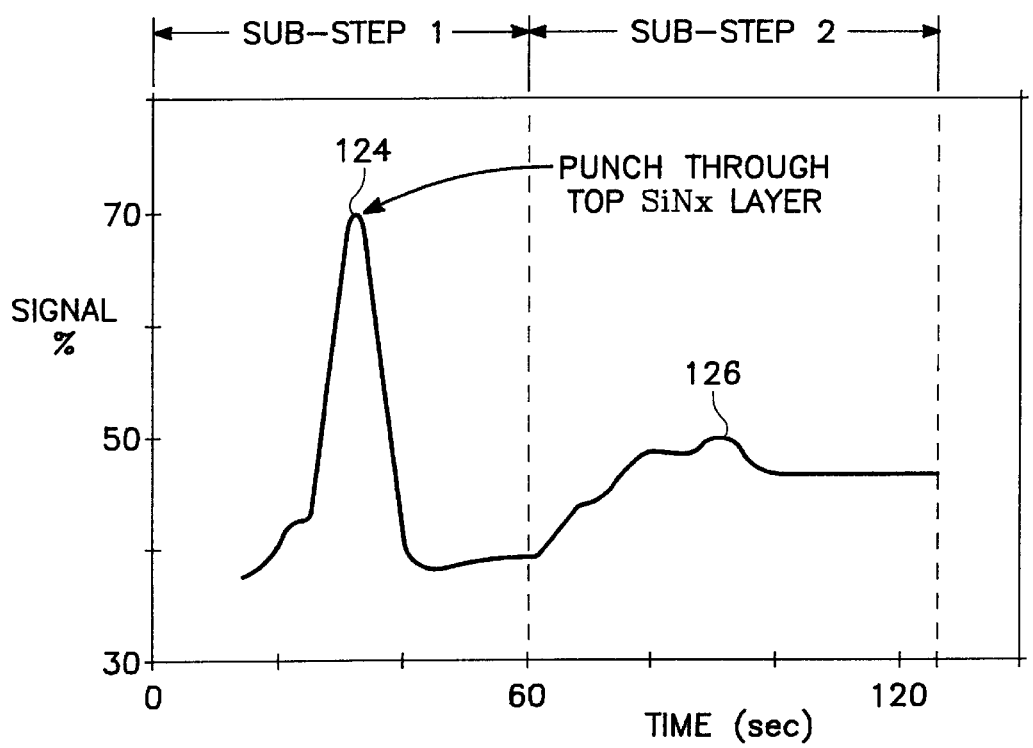
FIG. 13 is an optical emission profile for monitoring the endpoint of the etching process of FIG. 10.

In the experimentally tested example, the oxide etch rate was about 850 nm/min, and the via profile was very close to 90°. The nitride loss for the bottom stop layer was minimal even with a 20% overetch. In FIG. 13 is illustrated the output of the end point detector which monitors the optical emission associated with the CN radical during the via etching. The signal strength indicates the amount of nitride being etched. A first peak 124 during the first substep is associated with the punch through of the upper nitride stop layer. A second, broader peak 126 is associated with the selective etch stopping on the lower nitride stop layer.

The etch recipe was determined based on the following considerations. The deep via etch resembles a typical contact structure with an aspect ratio of about 5.5:1. In the example of TABLE 2, trifluoromethane ($CHF_3$) is used as the main etchant gas with argon (Ar) as the chemically inactive diluent to constitute a relative lean chemistry for high oxide etch rate and vertical profile. Other diluent gases such as neon (Ne) are available. It is believed that $CHF_3$ primarily forms neutral $CF_2^*$ radicals in the plasma which react with $SiO_2$ to form volatile $SiF_x$ and CO. By a lean chemistry is meant that the F/C ratio of $CHF_3$ is a relatively high value of 3 or greater resulting in strong etching of $SiO_2$ and low polymerization. Another single-hydrogen fluorocarbon that can be used as the lean principal etching gas is pentafluoroethane ($C_2HF_5$). Carbon tetrafluoride ($CF_4$) is also known as a lean etching gas. A high flow rate of the principal etching gas $CHF_3$ is used to increase the oxide etch rate by the use of appropriate power settings.

Argon ions activate the surface etching chemistry when they strike the surface with a relatively high energy but less than that associated with sputter etching.

The addition of hexafluoroethane ($C_2F_6$) supplies a polymerizing gas to provide selectivity to the bottom nitride stop layer. It is believed that multi-carbon fluorocarbons such as $C_2F_6$ provide $C_2^*$ radicals required for effective polymerization during plasma etch, thus increasing etch selectivity to base layers as $SiN_x$ and Si. The $C_2F_6$ also provides sidewall passivation by forming a carbon-rich polymer on the oxide sidewalls, thereby reducing bowing of the via hole. The combination of the single-carbon hydrofluoromethane $CHF_3$ and the higher-carbon fluorocarbon $C_2F_6$ provides selectivity to $SiN_x$ and a vertical via profile with good etch depth margin. A minimum selectivity of 5:1 of etching oxide to nitride is required. Even higher values are desired, e.g. 10:1. Unless stated otherwise, a fluorocarbon is understood to include a hydrofluorocarbon. In contrast, typical etch processes with high nitride selectivity often result in tapered profiles, which impacts the via resistance. The ratio of the principal etching gas to the lesser amount of polymer former is 8:1 in the example. A most preferred range is 4:1 to 16:1.

In order to punch through the upper nitride stop layer, an oxygen-containing gas providing a source of oxygen consumes any polymer building up on the silicon nitride since $SiN_x$ unlike $SiO_2$ does not contain oxygen. In the example of TABLE 2, the oxygen-containing gas is carbon monoxide (CO). The interaction of the oxygen in the plasma and carbon in the polymer produces volatile carbon monoxide, thereby reducing the selectivity to the oxygen-free nitride. Molecular oxygen ($O_2$) can be used for this purpose, but an $O_2$ plasma also efficiently etches photoresist. The selectivity to photoresist should be kept as high as possible to maintain the photomasking with a minimum initial thickness. In the high-density plasma achievable in the inductively coupled IPS chamber of FIG. 9, CO dissociates into C* and O* radicals, thereby providing a source of oxygen for nitride polymer removal without excessive photoresist removal. It is noted that the use of CO for decreasing selectivity to nitride or silicon is contrary to the teachings of Tahara in U.S. Pat. No. 5,356,515, according to which increasing the flow of CO in a fluorocarbon plasma etch process increases the selectivity to nitride.

The relatively high pressure of 75 milliTorr used in the recipe of TABLE 2 increases the selectivity to photoresist and at the same time increases the oxide etch rate. A preferred range of pressures is 40 to 150 milliTorr. A more preferred range is 60 to 100 milliTorr. Also a good profile is achieved with the combination of high flow and high pressure achieved by flowing the diluent gas at at least twice the rate of the etching gases.

The total source power of 3020 W with a power ratio of 3.25 between outer and inner coils provides good uniformity of etch across the wafer.

The lower silicon roof temperature of 145° C. is used to increase the etch rate and etch depth margin since the silicon roof acts as a fluorine-scavenging surface providing selectivity to photoresist. Similarly, a hot silicon ring at 350° C. is used to scavenge free fluorine F* in the plasma. The elevated silicon temperatures, particularly keeping the silicon ring above 200° C. and the silicon roof above 130° C., keeping the roof free of polymer, thus reducing particulates and providing a clean process. The wafer temperature is kept low by means of high helium backside pressure and low chiller temperature to promote polymerization and reduce the photoresist etch rate.

The only significant change between the two substeps is the supply of CO, which affects nitride etching. The oxide etch rate should be about the same. The transition between the two substeps can be quickly made. Although it is not necessary, advantageously the plasma should be maintained through the sequence of substeps with the gas flows changing only in fairly minor extent to affect the selectivity. In the two-substep process of TABLE 2, the active gas flow changes less than 30% between the substeps, the other process parameters being maintained constant with no interruption of the plasma. The chemically inactive diluent gas, Ar, has a flow of four times that of the active gases. Similar effects are expected with a factor of two or greater. The process can be readily modified for different dielectric stack structures by changing the etching times for the respective substeps.

Figure 14:
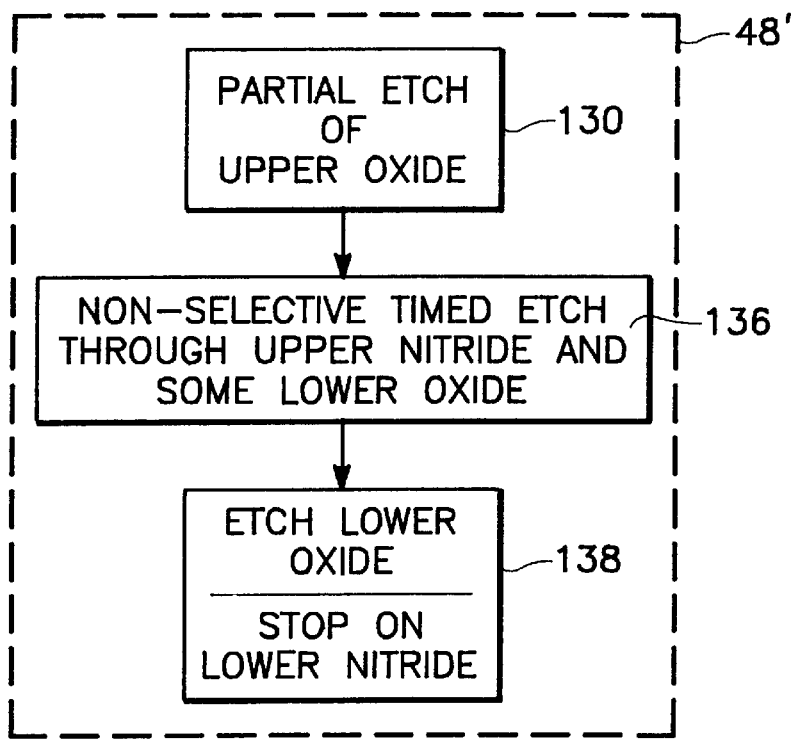
FIG. 14 is a process flow diagram for an inventive 3-substep form of the via etching step of the counterbore dual-damascene etch process of FIG. 2.
Figure 15:
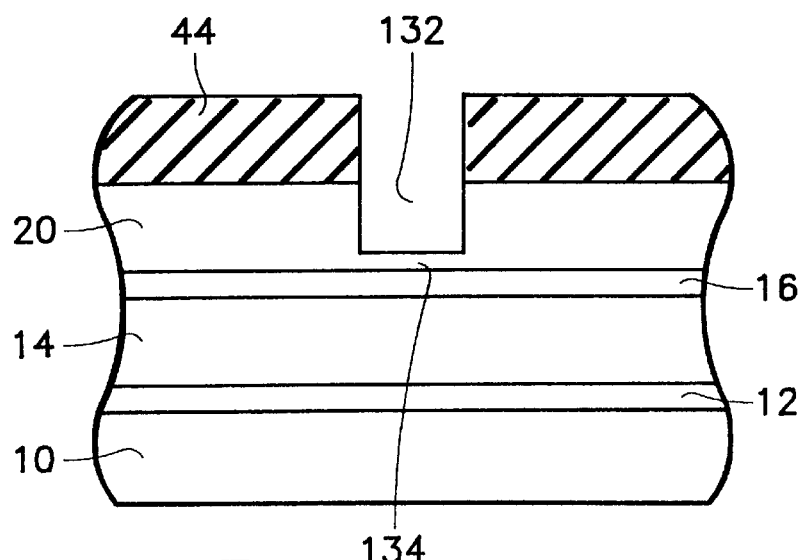
FIG. 15 is cross-sectional view of one intermediate structure in the 3-substep via etch step of FIG. 14.

An alternative 3-substep via etching step 48' is shown by the flow diagram of FIG. 14 with reference to the cross-sectional views of FIGS. 15, 11, and 12. In the first substep 130, a nitride-selective etch forms a first hole 132, as illustrated in FIG. 15, that only partially extends through the upper oxide layer 20, leaving a thin portion 134 of the oxide layer 20 under the hole 132. Preferably, the first substep 130 involves an etching chemistry that includes no carbon monoxide and is selective to nitride. Such a chemistry is relatively selective to the photoresist so as to protect the hard mask as long as possible. The selectivity provides a vertical profile and also provides process margin since the etch cannot significantly extend into the upper nitride layer 16. Such an etch that selectively etches oxide over nitride is well known and is not particularly difficult since the hole 132 at that point has a relatively low aspect ratio and the selectivity to nitride need not be high for the small fraction of holes in which the upper nitride layer 16 is exposed. The first substep 130 is a timed step and does not critically rely upon the selectivity of the etch. It is possible to extend the time of the first substep 130 so that the etch would reliably extend to but stop on the upper nitride layer 16. That is, in this variant the thin oxide portion 134 disappears during the first substep 130.

The second and third substeps 136, 138 are functionally similar to the substeps 120, 124 of the two-substep process 48 of FIG. 10. The second substep 136 etches through the upper nitride layer 16, as illustrated in FIG. 11. It may be a timed etching step that is relatively unselective between oxide and nitride. The timing is chosen so that the hole 132 is deepened to the hole 122 which reliably extends through the upper nitride layer 16 and may extend part way into the lower oxide layer 14. Verticality is desired but is not critical in view of the relative shallowness of the second etching substep 124.

The third etching substep 138 completes the formation of the extended via hole 50, as illustrated in FIG. 12. The time of the third substep 138 is chosen to be sufficiently long that the etch reaches and stops on the lower nitride layer 12. This etching substep is difficult because of the high aspect ratio of the hole 50, which promotes etch stop. Good verticality and moderately high selectivity to nitride is also required. Generally, stronger polymer formation is required in the final substep 138, but etch stop should be prevented by the continued use of a lean chemistry. One example of the etching gases used in this substep 126 includes the principal etchant trifluoromethane ($CHF_3$), a lesser amount of the polymer former octafluorocyclobutane ($C_4F_8$), and a large amount of the diluent argon. Trifluoromethane is lean relative to $C_4F_8$ in forming polymer, thereby reducing the risk of etch stop. Selectivity to nitride is enhanced by maintaining the silicon ring at a relatively high temperature to scavenge fluorine from the plasma.

EXAMPLE 2

The 3-substep via etch was tested using a dielectric stack having a structure summarized in TABLE 3. The via mask aperture had a diameter of 0.6 µm and the total oxide thickness was much thicker, so this dual-damascene structure is more appropriate for a power level.

TABLE 3

|  | Composition | Thickness (nm) |
|---|---|---|
| Upper Dielectric | Oxide | 1400 |
| Upper Stopper | Nitride | 50 |

TABLE 3-continued

|  | Composition | Thickness (nm) |
|---|---|---|
| Lower Dielectric | Oxide | 1000 |
| Lower Stopper | Nitride | 50 |

The 3-substep process recipe that was developed for the broader trench geometry is summarized in TABLE 4.

TABLE 4

|  | First Substep | Second Substep | Third Substep |
|---|---|---|---|
| $CHF_3$ Flow (sccm) | 90 | 90 | 80 |
| $CH_2F_2$ Flow (sccm) | 10 | 10 | 0 |
| CO Flow (sccm) | 0 | 15 | 0 |
| $C_4F_8$ Flow (sccm) | 0 | 0 | 10 |
| Ar Flow (sccm) | 425 | 425 | 425 |
| Inner Source Power (W) | 610 | 610 | 610 |
| Outer Source Power (W) | 2100 | 2310 | 2310 |
| Bias Power (W) | 1400 | 1400 | 1400 |
| Pressure (mT) | 75 | 75 | 75 |
| Roof Temp. (° C.) | 145 | 145 | 145 |
| Ring Temp. (° C.) | 350 | 350 | 350 |
| Cathode Temp. (° C.) | −10 | −10 | −10 |
| Backside He Pressure (T) | 15 | 15 | 15 |
| Time (s) | 70 | 50 | 60 |

The example yielded an oxide etch rate of 930 nm/min. The via profile was vertical at close to 90°. The nitride loss at the bottom stop layer was less than 10 nm after a 16% overetch.

The recipe is similar to that for the 0.3 µm process. However, the oxide is thicker and the nitride stop layers are thinner so that the total etch time is much longer for the same photoresist thickness of 900 nm.

In order to reduce photoresist etch rate, difluoromethane ($CH_2F_2$) is added for the first and second substeps. Difluoromethane is a dihydrofluorocarbon providing a source of hydrogen, which is believed to scavenge free fluorine in the plasma and promotes polymerization on the photoresist to improve selectivity to photoresist.

Carbon monoxide (CO) is added in the second substep to reduce selectivity to nitride when punching through the upper nitride layer. Carbon monoxide is useful in this step since it affords reasonably good selectivity to the photoresist. Carbon dioxide ($CO_2$) has the potential of providing the same selectivity to nitride in a high-density plasma, but experiments have shown a degradation in selectivity to photoresist relative to CO, probably because of a different degree of dissociation in the plasma. Gaseous oxygen ($O_2$) would be expected to be non-selective.

Octafluorocyclobutane ($C_4F_8$) is added in the critical third substep to increase selectivity to the lower nitride layer. It, like $C_2F_6$, provides $C_2$ species for effective polymerization and resultant nitride selectivity. Since the nitride layer is thinner in this structure, $C_4F_8$ is chosen over $C_2F_6$ because of its greater polymerizing power over either the $C_2F_6$ or $CH_2F_2$ used in the first two substeps. It is generally easier to form polymer on small exposed nitride surfaces as compared to the larger exposed surfaces experienced here. For small features size, $C_2F_6$ is more desirable since it provides adequate nitride selectivity without sacrificing etch depth in the via, that is, without etch stop. For larger feature sizes, $C_4F_8$ can be used to provide high nitride selectivity without too much concern about etch depth margin.

Generally, the longer the carbon molecule, the better it performs as a polymer former. Some carbon in the fluorocarbon also indicates stronger polymer formation.

The critical etching steps are preferably performed in a high-density plasma. First, it affords a higher etch rate. Secondly, the separate biasing of the pedestal allows control of the ion energy without sacrificing etching rate. Thirdly, it has been experimentally observed that a polymer formed in a high-density plasma has a higher carbon-to-fluorine ratio. A low-fluorine polymer provide better selectivity to underlying layers not containing oxygen.

Each of the two-substep and three-substep processes summarized in TABLES 2 and 3 is preferably performed in a single high-density plasma reactor in an essentially continuous process. The RF powers and more importantly the various temperatures are maintained the same so no reequilibration is required. The gas flow of the principal etchant $CHF_3$ is maintained constant to within 15% with only the selective additions of the polymer formers and the oxygen-containing CO, to an extent of no more than 30% of the active gas flow. The oxygen-containing CO has a flow rate of less than 25% of the active etching gases and less than 20% of the primary etchant $CHF_3$. Additionally, the high diluent flow, greater than twice that of the active gases, allows the gas pressure to remain essentially constant with no adjustment of the throttle valve. Thereby, the substeps smoothly transition with no interruption of the plasma.

Although the via etch is the critical step for the counter-bore dual-damascene etch, the trench etch, its photomasking, and the lower stop removal must be performed consistent with the entire process. These further steps are part of an integrated process disclosed by Hung et al. in concurrently filed Ser. No. 09/112,094, filed Jul. 9, 1998, entitled IN SITU DIELECTRIC ETCH PROCESS FOR IC STRUCTURES USING COPPER INTERCONNECTS and incorporated herein in its entirety. The details of the other parts of the integrated process are not essential to this invention. An unexpected feature of the integrated process is that it is preferred to strip the photoresist in the post-etch treatment (PET) or ashing step before the lower nitride stop layer is removed. Exemplary process recipes for these steps are summarized in TABLE 5. These steps can be sequentially performed also in the IPS chamber of FIG. 9 after the formation of the trench photomask. The IPS chamber may be the same chamber or another one. Alternatively, since the trench etch and other steps associated with it are not so critical, it is possible to perform them in a less sophisticated plasma etch reactor, for example, one relying solely upon RF capacitive between the pedestal and the grounded chamber walls.

TABLE 5

|  | Trench Etch | Ash | Nitride Etch |
|---|---|---|---|
| $C_4F_8$ Flow (sccm) | 14 | 0 | 0 |
| $CH_2F_2$ Flow (sccm) | 0 | 0 | 40 |
| $O_2$ Flow (sccm) | 0 | 400 | 60 |
| Ar Flow (sccm) | 100 | 0 | 100 |
| Inner Source Power (W) | 260 | 800 | 420 |
| Outer Source Power (W) | 1040 | 2400 | 1320 |
| Bias Power (W) | 1400 | 150 | 150 |
| Pressure (mT) | 7 | 60 | 9 |
| Roof Temp. (° C.) | 180 | 180 | 180 |
| Ring Temp. (° C.) | 270 | 270 | 270 |
| Cathode Temp. (° C.) | +10 | +10 | +10 |
| Backside He Pressure (T) | 15 | 15 | 15 |
| Time (s) | 100 | 60 | 100 |

The trench etch when performed with the 0.3 μm counterbore via with the above recipe produced an oxide etch rate of 600 nm/min. The trench profile was slightly V-shaped at between 85° and 90°. The nitride loss of the upper stop layer was less than 20 nm with a 20% over etch. The bottom stop layer lost significant thickness, but there was no punch through.

The chemistry used in the exemplary trench etch uses $C_4F_8$/Ar at low source power. Since the trench etch is performed with a low aspect ratio with a large area of exposed $SiN_x$ at the upper stop layer and an unprotected bottom $SiN_x$ layer, it is desirable to use a highly polymerizing process with a low ion density to minimize sputtering of $SiN_x$. The highly polymerizing nature of $C_4F_8$ provides good selectivity to the top nitride layer. The lower source power reduces the ion density, which in turn reduces the sputtering of the $SiN_x$ corner of the upper stop layer, to thereby maintain the critical dimension of the via. A relatively high silicon roof temperature of 200° C. is used as an additional control to increase selectivity to nitride. The relatively low chamber pressure of 7 mT is used in this case to minimize micro-loading between different sizes of the trenches, which can range between 0.3 μm to greater than 1 μm. Micro-loading produces differential etching rates for different geometries, which results in $SiN_x$ erosion in one of the geometries. The lower pressure also produces a more vertical profile, especially for the highly polymerizing chemistry being used in the trench etch.

The photoresist and polymer are stripped in a typical ashing step summarized in TABLE 5 using only $O_2$ at high source power and low bias power. The stripping is performed prior to the nitride removal step to avoid residue originating form the polymer coming from the roof and wafer.

The third and final etch step 66 removing the exposed lower stop layer 12 is typically a soft plasma etch to avoid copper sputtering and the formation of a residue.

The various temperature settings for all three steps in TABLE 5 are the same allowing a quick transition between the steps.

Although the examples of the invention have relied upon the inductively coupled IPS chamber, other etch reactor and particularly other types of high-density plasma reactors may be used advantageously with the invention.

Although the examples of the invention have used layers of PECVD $SiO_2$ and $Si_3N_4$ for the oxide and nitride layers, the invention is not so limited. There are other forms of silicon oxide, such as borophosphosilicate glass (BPSG), fluorinated silica glass (FSG), and spin-on glass (SOG) and other forms of oxygen-free silicides. Indeed, the broader aspects of the invention are not limited to only silicon-based dielectrics and stop layers but may be extended to carbon-based materials for one or both of these types of layers.

It is thus seen that the deep via etch through multiple layers can be efficiently and quickly performed in a single etch reactor while providing a highly desirable structure, particularly in conjunction the counterbore dual-damascene structure. However, the invention is not limited to a dual-damascene structure but may be applied to other multi-layer dielectric structures.

Although the recipes of the examples are presented for the combination of silicon oxide and silicon nitride, many aspects of the invention can be applied to other dielectric structures, including those using carbon-based low-k dielectrics.

What is claimed is:

1. A multi-level dielectric etch method, comprising the steps of:

placing into a plasma reactor a substrate containing a layered structure formed over a substrate and comprising sequentially, from a bottom thereof, a first stop layer, a first dielectric layer, a second stop layer, a second dielectric layer, and a first photomask patterned with at least one first aperture;

a first flowing step of flowing a first gas mixture into said reactor and exciting it into a first plasma, said first plasma capable of etching both said second dielectric layer and said second stop layer;

continuing said first step at least until said second stop layer is etched through;

a second flowing step, performed without removing said substrate from said reactor after said first flowing step, of flowing a second gas mixture into said reactor and exciting it into a second plasma, said second plasma etching said first dielectric layer selectively to said first stop layer; and then forming a second photomask on said structure including a second aperture having an area surrounding an area of said at least one first aperture; and a subsequent third step of flowing a third gas mixture into a plasma reactor and exciting it into a third plasma, said third plasma selectively etching said second dielectric layer selectively to said second stop layer.

2. The method of claim 1, wherein said reactor is capable of producing a high-density plasma.

3. The method of claim 1, wherein said reactor includes an inductively coupled plasma source region and a capacitively coupled substrate support.

4. The method of claim 1, wherein said second gas mixture comprises a lean fluorocarbon gas, a first fluorocarbon gas more highly polymerizing than said lean fluorocarbon gas, and a chemically inactive gas.

5. The method of claim 4, wherein said lean fluorocarbon gas comprises $CHF_3$.

6. The method of claim 4, wherein said first fluorocarbon gas is selected from the group consisting of $C_2F_6$ and $C_4F_8$.

7. The method of claim 1, wherein said first and second dielectric layers comprise silicon oxide and said first and second stop layers comprise silicon with substantially no oxygen.

8. The method of claim 7, wherein said first and second stop layers comprise silicon nitride.

9. The method of claim 7, further comprising heating a silicon-containing element of said reactor to a temperature of at least 130° C. during said second step.

10. The method of claim 9, wherein said temperature is at least 300° C.

11. The method of claim 7, wherein said first gas mixture comprises a lean fluorocarbon selected from the group consisting of $CHF_3$ and $C_2HF_5$, a first fluorocarbon gas more highly polymerizing than said lean fluorocarbon, an oxygen-containing gas, and a chemically inactive gas.

12. The method of claim 11, wherein said oxygen-containing gas comprises CO.

13. The method of claim 11, wherein said first fluorocarbon gas is selected from the group consisting of $CH_2F_2$ and $C_2F_6$.

14. The method of claim 11, wherein said lean fluorocarbon comprises $CHF_3$.

15. The method of claim 14, wherein said second gas mixture comprises $CHF_3$, a second fluorocarbon gas more highly polymerizing than $CHF_3$, and said chemically inactive gas.

16. The method of claim 15, wherein said second fluorocarbon gas is selected from the group consisting of $C_2F_6$ and $C_4F_8$.

17. The method of claim 15, wherein a flow of said $CHF_3$ is varied by no more than 15% between said first and second flowing steps and a flow of said oxygen-containing gas is no more than 20% of a flow of said $CHF_3$ in said first flowing step.

18. The method of claim 15, wherein said chemically inactive gas comprises argon and a flow of said argon in said first and second flowing steps is at least twice that of other gases.

19. An etching method, comprising the steps of:

providing a substrate having formed on the surface a sequentially arranged structure comprising a lower nitride layer, a lower oxide layer, an upper nitride layer, and an upper oxide layer;

defining a first photomask over said structure having a plurality of first apertures;

placing said substrate defined with said first photomask into a first plasma reactor having an inductive coil powered by a first RF power supply and a pedestal supporting said substrate and powered by a second RF power supply;

a first step of flowing a first gas mixture into said reactor and exciting it into a first plasma, said first plasma etching both said upper oxide layer and said upper nitride layer;

continuing said first step until said upper nitride layer is etched through;

a second step, performed without removing said substrate from said reactor after said first flowing step, of flowing a second gas mixture into said reactor and exciting it into a second plasma, said second plasma etching said lower oxide layer selectively to said lower nitride layer until said lower nitride layer is exposed; and then defining a second photomask over said structure having at least one second aperture surrounding an area including areas of said first apertures;

placing said substrate defined with said second photomask into a second plasma reactor which may be the same as said first plasma reactor; and a subsequent third step of flowing a third gas mixture into said second reactor that etches said upper oxide layer selectively to said upper and lower nitride layers.

20. The method of claim 19, wherein said first gas mixture comprises a lean fluorocarbon gas, a first fluorocarbon gas more polymerizing than said lean fluorocarbon gas, an oxygen-containing gas, and a diluent gas.

21. The method of claim 20, wherein said diluent gas comprises Ar.

22. The method of claim 21, wherein flows of said diluent gas in said first and second flowing steps is are at least twice respective total flows of said first and second gas mixtures other than said diluent gas.

23. The method of claim 20, wherein said lean fluorocarbon gas comprises $CHF_3$.

24. The method of claim 23, wherein said oxygen-containing gas comprises CO.

25. The method of claim 24, wherein said first fluorocarbon gas comprises $C_2F_6$.

26. An etching method, comprising the steps of:

providing a substrate having formed on the surface a sequentially arranged structure comprising a lower nitride layer, a lower oxide layer, an upper nitride layer, and an upper oxide layer;

defining a first photomask over said structure having a plurality of first apertures;

placing said substrate defined with said first photomask into a first plasma reactor having an inductive coil powered by a first RF power supply and a pedestal support said substrate and power by a second RF power supply;

a first step of flowing a first gas mixture into said first reactor and exciting it into a first plasma, said first plasma etching said upper oxide layer selectively to said upper nitride layer;

a second step of flowing a second gas mixture into said first reactor and exciting it into a second plasma, said second plasma etching said upper nitride layer until said nitride layer is etched through; and a third step of flowing a third gas mixture into said first reactor and exciting it into a third plasma, said third plasma etching said lower oxide layer selectively to said lower nitride layer until said lower nitride layer is exposed;

then defining a second photomask over said structure having at least one second aperture surrounding an area including areas of said first apertures;

placing said substrate defined with said second photomask into a second plasma reactor which may be the same as said first plasma reactor; and a subsequent fourth step of flowing a fourth gas mixture into said second reactor that etches said upper oxide layer selectively to said upper and lower nitride layers;

wherein said substrate is not removed from said first reactor between said first, second, and third flowing steps.

27. The method of claim 26:

wherein said first gas mixture comprises a lean fluorocarbon gas, a first fluorocarbon gas more heavily polymerizing tan said lean fluorocarbon gas, and argon;

wherein said second gas mixture comprises said lean fluorocarbon gas, said first fluorocarbon gas, an oxygen-containing gas, and argon; and wherein said third gas mixture comprises said lean fluorocarbon gas, a second fluorocarbon gas more heavily polymerizing than said first fluorocarbon gas, and argon.

28. The method of claim 27, wherein said lean fluorocarbon gas comprises $CHF_3$.

29. The method of claim 28, wherein said first fluorocarbon gas comprises $CH_2F_2$ and said second fluorocarbon gas comprises $C_4F_8$.

30. A multi-level dielectric etch method, comprising the steps of:

placing into a first plasma reactor a substrate containing a layered structure formed over a substrate and comprising sequentially from a bottom thereof a first stop layer, a first dielectric layer, a second stop layer, a second dielectric layer, and a first photomask patterned with at least one first aperture;

a first flowing step of flowing a first gas mixture into said first plasma reactor and exciting it into a first plasma, said first plasma etching said second dielectric layer selectively to said second stop layer a second flowing step of flowing a second gas mixture into said first plasma reactor and exciting it into a second plasma, said second plasma capable of etching said second stop layer;

continuing said second flowing step at least until said second stop layer is etched through; and a third flowing step of flowing a third gas mixture into said first plasma reactor and exciting it into a third plasma, said third plasma etching said first dielectric layer selectively to said first and second stop layers;

then forming a second photomask on said structure including a second aperture having an area surrounding an area of said at least one first aperture; and a subsequent fourth step of flowing a fourth gas mixture into a plasma reactor containing said substrate having said structure and exciting it into a fourth plasma, said fourth plasma selectively etching said second dielectric layer selectively to said second stop layer;

wherein said first, second and third flowing steps are performed without therebetween removing said substrate from said first plasma reactor.

31. The method of claim 30, wherein said first and second dielectric layers comprise silicon oxide and said first and second stop layers comprise silicon nitride.

32. The method of claim 31, wherein said second gas mixture comprises a lean fluorocarbon gas, a first fluorocarbon gas more highly polymerizing than said lean fluorocarbon gas, an oxygen-containing gas, and a chemically inactive gas.

33. The method of claim 32, wherein said lean fluorocarbon gas comprises $CHF_3$.

* * * * *